United States Patent [19]

Buynoski

[11] Patent Number: 4,761,386

[45] Date of Patent: Aug. 2, 1988

[54] METHOD OF FABRICATING CONDUCTIVE NON-METALLIC SELF-PASSIVATING NON-CORRODABLE IC BONDING PADS

[75] Inventor: Matthew S. Buynoski, Palo Alto, Calif.

[73] Assignee: National Semiconductor Corporation, Santa Clara, Calif.

[21] Appl. No.: 888,553

[22] Filed: Jul. 21, 1986

Related U.S. Application Data

[62] Division of Ser. No. 663,653, Oct. 22, 1984, Pat. No. 4,622,576.

[51] Int. Cl.⁴ .............................................. H01L 21/66
[52] U.S. Cl. ................................... 437/203; 437/193; 437/200; 437/220; 148/DIG. 125; 357/67; 357/71; 357/69
[58] Field of Search ................. 29/590, 591; 228/123, 228/904; 357/71, 71 S, 67 S, 68, 59 G, 55, 53, 84; 148/DIG. 167; 437/203, 193, 200

[56] References Cited

U.S. PATENT DOCUMENTS

| | | | |
|---|---|---|---|
| 3,806,361 | 4/1974 | Lehner | 437/193 |
| 4,106,051 | 8/1978 | Dormer et al. | 357/71 |
| 4,109,275 | 8/1978 | Sarkary | 357/68 |
| 4,149,301 | 4/1979 | Cook | 29/25.42 |
| 4,628,590 | 12/1986 | Udo et al. | 437/193 |

Primary Examiner—Brian E. Hearn
Assistant Examiner—Beverly Pawlikowski
Attorney, Agent, or Firm—Gail W. Woodward

[57] ABSTRACT

A monolithic silicon integrated circuit chip is provided with a conductive passivating coating over the metal bonding pads. The coating is composed of doped polysilicon or metal silicide. Such materials provide a self-passivating, non-corrodable surface capable of forming a conventional eutectic bond to a connecting wire. A moat is etched through this layer outside the confines of the bonding pad so that they can be electrically isolated. Eutectic wire bonds are then made to the coating where they would ordinarily be made to the pad metal. Since the passivating coating fully covers the bonding pad a substantial increase in passivation occurs. If desired the passivating coating can be overcoated with a thin metal layer to facilitate probing of the circuits in wafer form.

6 Claims, 2 Drawing Sheets

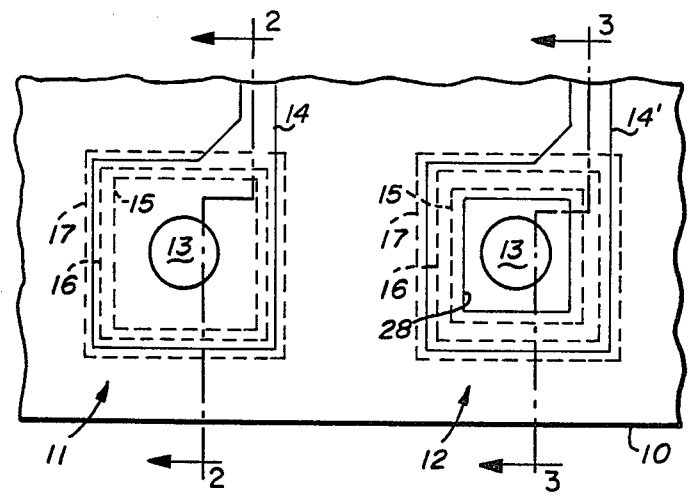
Fig_1
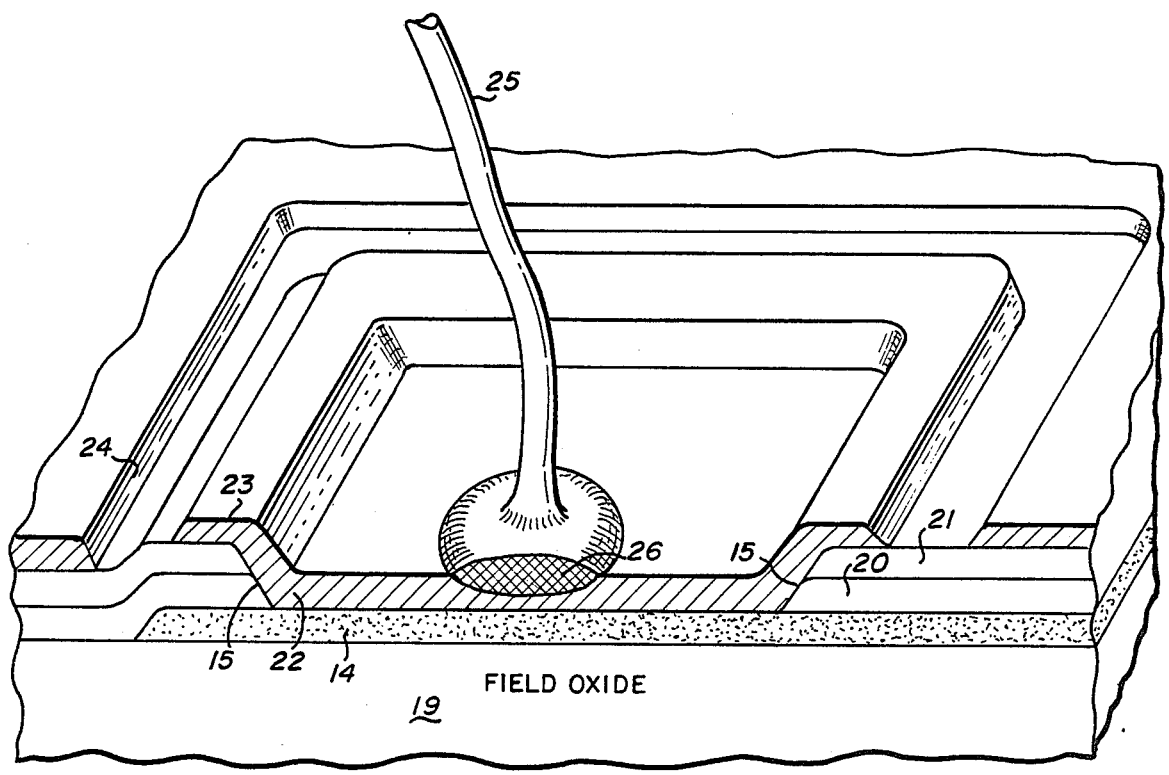
Fig_2

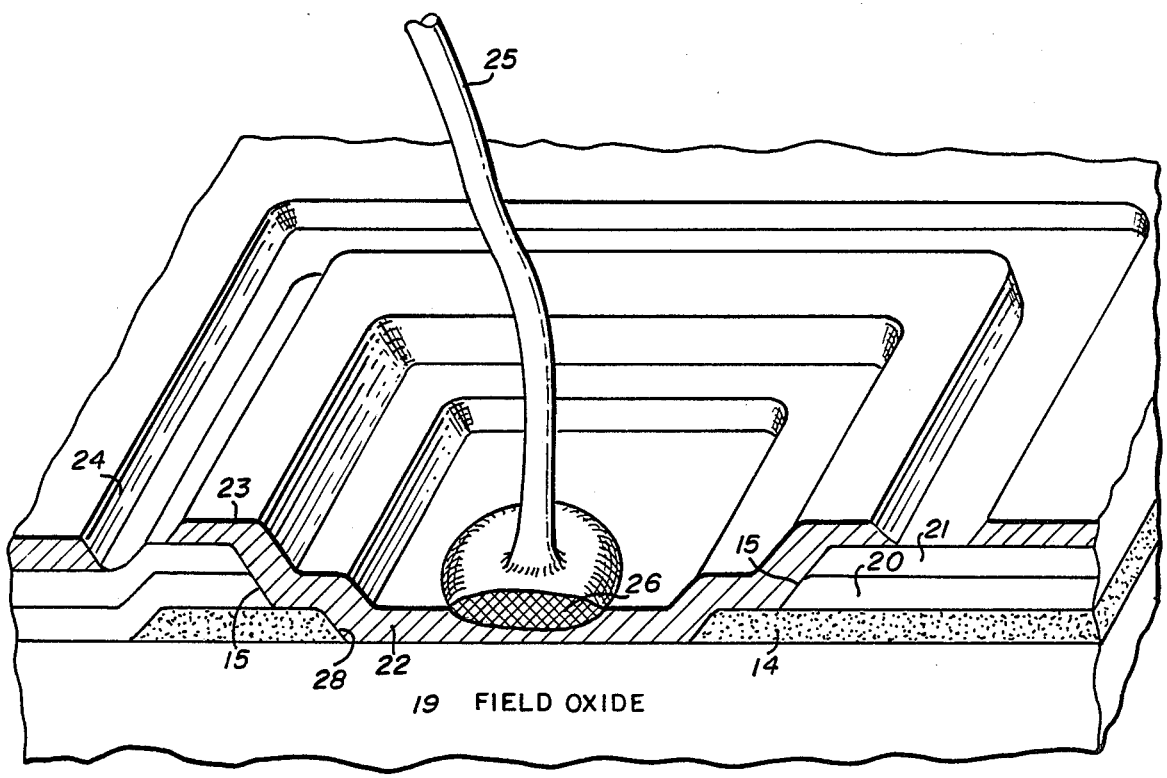
Fig_3

METHOD OF FABRICATING CONDUCTIVE NON-METALLIC SELF-PASSIVATING NON-CORRODABLE IC BONDING PADS

This is a divisional of co-pending application Ser. No. 663,653 filed on Oct. 22, 1984, now U.S. Pat. No. 4,622,576, issued Nov. 11,1986.

BACKGROUND OF THE INVENTION

In monolithic silicon integrated circuit (IC) devices the individual circuit chips are mounted in a suitable housing which includes a plurality of connection leads that are connected to an array of bonding pads on the IC chip. Typically these bonding pads are located adjacent to the chip edges in a peripheral array. Some form of connection lead makes contact with each bonding pad. The pad is made large enough to accomodate the lead so that the mechanical tolerances of lead location will not exceed pad size.

In silicon IC devices the typical metallization is aluminum which is commonly overcoated with a passivation material such as vapor deposited silicon dioxide (vapox) or silicon nitride or polyimide plastic. In many cases this vapox contains a substantial percentage of phosporous oxide which enhances its protective capability. Such a glass is called phospho-silicate glass (PSG). This passivation is quite effective and will protect the IC from moisture, metal particles, organics and other contaminants that can deleteriously affect the device. It has been found that the aluminum metallization can be attacked electrolytically by moisture that seeps into the final package in minute quantities.

The passivation mentioned above will prevent such action but, in order to contact the IC, the passivation must be removed over the contact area of the bonding pads. Thus the aluminum bonding pads must be exposed. This means that moisture can penetrate the bonding pad area and proceed to pass underneath the passivation layer thus circumventing the passivation.

It would be desirable to passivate the bonding pads so that even if moisture is present it will not attack the pad metal.

SUMMARY OF THE INVENTION

It is an object of the invention to render the IC bonding pads immune to moisture contamination by coating them with a layer of conductive material that is non-metallic, self-passivating and non-corrodable.

It is a further object of the invention to extend the conventional IC passivation to where it covers and encapsulates the edges of the IC bonding pads and to coat the remainder of the pad with a layer of heavily doped polycrystalline silicon or metal silicide.

It is a still further object of the invention to overcoat a passivated IC chip with and additional passivating layer of heavily doped polycrystalline silicon or metal silicide and to etch a moat in the additional passivating layer around the bonding pads so that the bonding pads are insulated but fully covered by a passivation layer which includes conductive material that is non-metallic, self-passivation and non-corrodable.

These and other objects are achieved in the following manner. A conventional IC is provided with a passivating layer of vapox followed by silicon nitride. This composite layer is etched away in those regions in the center of the bonding pads so that the passivation still covers the peripheral edges of the pad. The IC is then overcoated with a layer of heavily doped polycrystalline silicon (polysilicon) or metal silicide which forms a pad passivation layer. If desired a thin metal layer can be deposited over the pad passivation layer to facilitate subsequent wafer probe testing. Then a moat is etched through the pad passivation layer just outside the edge of hole in the original passivation layer. This leaves the pads with a conductive passivation cover. The IC assembly can then be completed by the eutectic bonding of wires through the thin metal layer over the bonding pads to the pad passivation layer.

BRIEF DESCRIPTION OF THE DRAWING

FIG. 1 is a plan view of IC contact pads showing two different pad forms.

FIG. 2 is a cross section side elevation view of the left hand pad of FIG. 1 taken along line 2—2.

FIG. 3 is a cross section side elevation view of the right hand pad of FIG. 1 taken along line 3—3.

DESCRIPTION OF THE INVENTION

FIG. 1 shows an IC chip fragment 10 wherein two kinds of bonding pad are shown. The left hand pad 11 is a square area of metal while the right hand pad is in the form of a square ring. These pads are located around the edge of the IC chip on top of the conventional field oxide. While two different pads are shown it is to be understood that these represent two embodiments of the invention. Actually in a particular IC all of the pads arrayed around the perimeter of the chip will be the same. The form employed is a design choice.

Circle 13 represents a wire bond area. A suitable bonding wire is pressed against the bonding pad and heated to achieve a eutectic bond. In this form of bond a pair of metals are present which form a low melting eutectic phase. The silicon-gold eutectic, which melts at about 370° C., is a preferred bond material. In the present case a gold wire is pressed against a silicon or silicon-containing bonding pad and the assembly heated above the eutectic temperature. A liquid phase develops and in effect forms a solder or braze which, after cooling, bonds the wire to the pad. While a gold wire is used, it can contain other metals. For example, a small percentage of silicon can be added to reduce the wire attack on the silicon during bonding.

The metal pad outline 14 represents the aluminum bonding pad that is located upon the silicon IC. The portion of the pad extending upwardly represents the extension that contacts the circuitry.

Dashed line 15 represents an opening in the conventional IC passivation which covers the IC (except for the pad center areas). This passivation overlaps the bonding pad periphery but the central portion of the pad is left open for receiving the wire bond 13. While the passivation layer has been omitted in FIG. 1 for clarity, it is ordinarily a layer a vapox applied by a low pressure vapox deposition (LPVD) process to a thickness of about a micron. If desired the vapox can be overcoated with a layer of silicon nitride applied with a plasma enhanced LPVD process to a thickness of about a micron. Since this passivation is applied over the IC metallization it acts to protect the metal conductors as well as the underlying silicon. This represents the prior art passivation which has proved to be quite effective. However since the center portion of the bonding pad is not covered, the aluminum can be attacked by contaminants within the opening. This also provides a point of entry where moisture can enter, propagate along and attack the metal surface under the passivation. Therefore while the prior art passivation is effective in resisting corrosion, its effect is not as complete a could be desired.

In the invention the conventional passivation is overcoated with a second passivation layer which fully covers the bonding pads. Since the bonding pads must be contacted, this second layer must be conductive. It is preferred that this layer be composed or heavily doped polysilicon or a metal silicide compound. The polysilicon is doped to an impurity level of about $10^{20}$ atoms/cm$^3$ to approach its solid solubility limit. Alternatively the metal silicides such as titanium, molybdenum, platinum, tantalum or other metal silicides can be used. These materials are self-passivating non-metallic, conductive and non-corrodable.

It is preferred that this second passivation layer be about one micron thick. If desired a thin (500 Å to 2000 Å) overcoat of metal can also be applied. It is preferred that this thin layer be composed of gold or aluminum but other metals can be used. This layer will facilitate IC wafer probing by providing a suitable probe contact surface. This metal is chosen so that a conductive layer is present which will not form undesirable intermetallic compounds with any of the IC components.

Dashed lines 16 and 17 represent a moat etched in the second passivation layer. This moat isolates the contact pad from the remainder of the conductive surface layer. This moat only needs to be outside the first passivation layer hole at 15. Thus the second passivation layer covers the contact pads where they would ordinarily be exposed. The second passivation layer is thereby left in place where it exists over the first passivation layer. This attribute increases the overall passivation performance.

FIG. 2 is a cross section of pad 11 of FIG. 1. It is also a front elevation view of the contact pad section. As was pointed out above the entire pad structure is located on top of the IC field oxide 19. Aluminum metal layer 14 is about a micron thick and is established directly upon field oxide 19. The first passivation layer is the vapox layer 20 and nitride layer 21 located directly upon metal layer 14 or the underlying oxide 19 where the metal does not cover. As pointed out above, layer 20 is applied by a LPVD process to a thickness of about a micron and layer 21 by a plasma enhanced LPVD process to a thickness of about a micron. After the first passivation layer is etched back in the creation of hole 15 the entire surface is covered with the second passivation layer. Sputtering is preferred for this step with the sputterer target being composed of the doped polysilicon or metal silicide material. Alternatively a LPVD process can be used to deposit the silicon and doping material or the metal silicide. The important aspect of this layer is the formation of a conductive silicon rich material that will form a self-passivation surface layer and simultaneously form a sealing layer. This layer is followed by a thin conductive layer 23 that covers layer 22 preferably applied by sputtering in the same chamber that was used to deposit layer 22.

Then a moat 24 is etched through layers 22 and 23 to form a ring around pad 14. This moat is located well outside hole 15 so that it only proceeds down to the first passivation layers. Thus the moat does not expose any of the critical surface layers. Actually all of layers 22 and 23 could be removed outside the moat area. However this would produce no additional benefit and leaving the material on the IC increases the overall device passivation.

At this stage of fabrication the IC wafer can be probe tested in the convention manner. This involves bringing an array of pointed electrical probes into contact with the bonding pads. The IC device can then be operated to test its electrical performance. The presence of layer 23 assures good probe contact.

Typically at this stage of IC fabrication the wafer is diced to create the individual IC chips. The chips are then mounted in an assembly device which include bonding pad contact means. To this end a bond wire 25, which has a ball at its end, is pressed into contact with that portion of layers 22 and 23 which lie over pad 14 and heat is applied to create a eutectic bond 26. Typically bond wire 25 is either made of or includes gold which forms a eutectic with silicon that melts at 370° C. All that needs to occur is heating the system above the eutectic while the wire is pressed in place. When the wire is pressed against the pad surface, it forces its way through the thin metal layer 23 and contacts layer 22. The silicon-gold eutectic will form at the interface and solder or braze the wire to the bonding pad. The free end of bond wire 25 is then attached to the assembly structure conventionally.

Then the assembly is encapsulated, preferably by the application of a transfer molded plastic housing (not shown). Because of the above-described passivation process, the encapsulated device is substantially immune to the effects of moisture entry into the housing that ordinarily occurs over a period of time after assembly.

The above-described structure and assembly requires the pressing of test probes and bond wires against the center of the bonding pad area. This can conceivably cause the rupture of the bonding pad metal 14 and the overlying layer 22. This can destroy the passivation by creating surface cracks through which moisture could enter. To avoid this the structure of FIG. 3 can be employed. This relates to pad 12 of FIG. 1. Bonding pad 14' is provided with a centrally located hole 28. Thus the metal pad is in the form of a ring.

The central hole 28 is located inside passivation ring 25 so that the upper surface of pad 14' is exposed inside ring 15. This means that when layer 22 is applied it makes electrical contact to pad 14' around the outside of hole 28. From FIG. 3 it is clear that since there is no metal directly below bond 26 the chance of rupture under probe or bond pressure is reduced. However since layer 22 is conductive the bond wire 25 will be electrically connected to pad 14'. Since only field oxide exists under bond region 26, there is little chance of rupturing layer 22 during wire bonding or wafer probing.

The invention has been described in sufficient detail to permit a person skilled in the art to practice it. When such a person reads the foregoing description, alternatives and equivalents, within the spirit and intent of the invention will be apparent. Accordingly it is intended that the scope of the invention be limited only by the following claims.

I claim:

1. In the process for fabricating the bonding pads in monolithic silicon integrated circuit devices located in a wafer wherein the metal bonding pads have been established and overcoated with a first insulating passivation layer that has openings located over the centers of the bonding pads, the steps comprising:

depositing a second passivation layer on said wafer, said second passivation layer being composed of a conductive material selected from the group consisting of doped polycrystalline silicon and metal silicide; and etching a moat in said second passivation layer around each bonding pad outside the confines of said opening in said first passivation layer.

2. The process of claim 1 wherein said second passivation layer is deposited by sputtering.

3. The process of claim 1 including the step of depositing a thin metal layer on top of said second passivation layer.

4. The process of claim 1 including the step of bonding a lead to said second passivation layer after said wafer has been divided into chips.

5. The process of claim 4 wherein said bonding is by way of a eutectic bond

6. The process of claim 5 wherein said lead is composed primarily of gold and said eutectic is silicon-gold.

* * * * *